(12) United States Patent
Carpenter et al.

(10) Patent No.: US 8,405,413 B2
(45) Date of Patent: Mar. 26, 2013

(54) CRITICAL PATH MONITOR HAVING SELECTABLE OPERATING MODES AND SINGLE EDGE DETECTION

(75) Inventors: Gary D. Carpenter, Austin, TX (US); Alan J. Drake, Austin, TX (US); Michael S. Floyd, Cedar Park, TX (US); Robert M. Senger, Tarrytown, NY (US)

(73) Assignee: International Business Machines Corporation, Armonk, NY (US)

( * ) Notice: Subject to any disclaimer, the term of this patent is extended or adjusted under 35 U.S.C. 154(b) by 285 days.

(21) Appl. No.: 12/861,289

(22) Filed: Aug. 23, 2010

(65) Prior Publication Data

US 2012/0043982 A1 Feb. 23, 2012

(51) Int. Cl.
*G01R 31/3187* (2006.01)
(52) U.S. Cl. .............. 324/750.3; 324/76.54; 716/113
(58) Field of Classification Search .......... 324/617, 324/76.54, 750.3
See application file for complete search history.

(56) References Cited

U.S. PATENT DOCUMENTS

| | | | |
|---|---|---|---|
| 5,870,404 A | 2/1999 | Ferraiolo et al. | |
| 6,185,706 B1 | 2/2001 | Sugasawara | |
| 6,535,735 B2 | 3/2003 | Underbrink et al. | |
| 6,924,679 B2 | 8/2005 | Seno et al. | |
| 6,958,659 B2 | 10/2005 | Nakajima | |
| 7,071,736 B2 | 7/2006 | Wikstrom | |
| 7,107,558 B2 | 9/2006 | Tetelbaum et al. | |
| 7,190,233 B2 | 3/2007 | Bhushan et al. | |
| 7,265,590 B2 | 9/2007 | Seki et al. | |
| 7,411,436 B2 | 8/2008 | Fang et al. | |
| 7,441,164 B2 * | 10/2008 | Guettaf | 714/718 |
| 7,576,569 B2 | 8/2009 | Carpenter et al. | |
| 7,810,000 B2 * | 10/2010 | Ngo et al. | 714/724 |
| 2002/0112213 A1 | 8/2002 | Abadir et al. | |
| 2002/0135343 A1 | 9/2002 | Underbrink et al. | |
| 2004/0130372 A1 | 7/2004 | Seki et al. | |
| 2005/0022145 A1 | 1/2005 | Tetelbaum et al. | |

OTHER PUBLICATIONS

Elgebaly, et al., "Efficient Adaptive Voltage Scaling System Through On-Chip Critical Path Emulation", ISLPED 2004, pp. 375-380.
Tschanz, et al., "Adaptive Body Bias for Reducing Impacts of Die-to-Die and Within-Die Parameter Variations on Microprocessor Frequency and Leakage", JSSC, v. 37, No. 11. Nov. 2002.

* cited by examiner

*Primary Examiner* — Melissa Koval
*Assistant Examiner* — Feba Pothen
(74) *Attorney, Agent, or Firm* — Mitch Harris, Atty at Law, LLC; Andrew M. Harris; Libby Z. Toub

(57) ABSTRACT

A critical path monitor having selectable data output modes provides additional information about critical path delay variation. A pulse is propagated through a synthesized path representing a critical path in a functional logic circuit and a synthesized path delay is measured by a monitoring circuit that detects the arrival of an edge of the pulse at the output of the synthesized delay. The measured delay is provided as a real-time output and a processed result of the measured delay is processed according to a data output mode selected from multiple selectable output modes, thereby providing different information describing the real-time data about critical path delay, such as a range of edge positions corresponding to a variation of the critical path delay.

20 Claims, 8 Drawing Sheets

CRITICAL PATH MONITOR HAVING SELECTABLE OPERATING MODES AND SINGLE EDGE DETECTION

This invention was made with government support under NBCH3039004 PERCS by the Defense Advanced Research Projects Agency (DARPA). The government has certain rights to this invention.

BACKGROUND OF THE INVENTION

1. Field of the Invention

The present invention is related to internal integrated circuit (IC) delay measurement circuits, and more particularly to a critical path monitoring circuit having a data output with selectable operating modes.

2. Description of Related Art

Process, voltage, temperature (PVT), e.g., voltage and temperature changes due to workload, as well as other noise sources cause timing variation within an IC design, making it necessary to provide timing margins that compromise the potential performance of designs. For example, in a processor core, the maximum frequency of the processor clock is dictated by the delay of a critical path within the processor, i.e., a path that, at the present operating temperature and voltage, will cause the processor to fail when the frequency of the processor clock is raised above a particular clock frequency. The critical path may be a single critical path for all operating conditions, or the critical path may change, for example, at different operating temperatures of the IC.

Critical path monitor (CPM) circuits have been implemented that simulate the critical path and provide information regarding the critical path delay of a processor or other IC. CPMs may synthesize critical path timing through such delay elements as wired interconnects within the IC and/or logic gates of the IC. CPMs can provide information to a phase-locked loop that generates the processor clock to provide real-time feedback of variations in the critical path delay, e.g., variation of the critical path delay with dynamic changes in the power supply voltage at particular locations within the IC. Although some CPMs generate a real-time average of the critical path delay, the CPMs may not provide other information useful for effective clock-frequency management and/or design evaluation. Further, as the sensitivity of the CPM is increased, errors due to circuit metastability or measurement circuit timing margins may cause error in the CPM measurement results.

Therefore, it would be desirable to provide a critical path monitoring circuit that can provide real-time delay measurement information in addition to processed indications of critical path delay. It would further be desirable to provide a CPM having correction that removes error in the measurement results.

BRIEF SUMMARY OF THE INVENTION

The invention is embodied in a method and circuit that monitor the delay of a critical path within an IC and provide real-time feedback and computed or corrected results according to a selected operating mode. The method is a method of operation of the circuit, which is integrated within the IC and which may be a processor core.

The IC includes a critical path monitor (CPM) that propagates a pulse through a synthesized path. A synthesized path delay is measured by a monitoring circuit that detects the arrival of an edge of the pulse. A data output circuit having multiple operating modes performs one or more operations on a result of the delay measurement, depending on the operating mode selected. Results are then provided in real-time by the data output circuit. A direct real-time output is also provided from the monitoring circuit.

One of the selectable operating modes may provide the raw, unprocessed output of the CPM. Other operating modes may include providing stabilized and bubble corrected output, a range of delay measurements, or a longest delay measurement since the last reset.

The foregoing and other objectives, features, and advantages of the invention will be apparent from the following, and more particular, description of the preferred embodiment of the invention, as illustrated in the accompanying drawings.

BRIEF DESCRIPTION OF THE SEVERAL VIEWS OF THE DRAWING

The novel features believed characteristic of the invention are set forth in the appended claims. However the invention itself, as well as a preferred mode of use, further objectives, and advantages thereof, will best be understood by reference to the following detailed description of the invention when read in conjunction with the accompanying Figures, wherein like reference numerals indicate like components, and:

DETAILED DESCRIPTION OF THE INVENTION

The present invention encompasses circuits and methods that measure critical path timing within an integrated circuit (IC), and, in particular, a critical path monitor (CPM) that provides real-time feedback and/or computed delay measurement results according to a selected operating mode. A pulse is propagated through one or more selected delay paths used to synthesize a delay indicative of a delay of the critical delay path, to a pair of edge detectors. The output of the edge detectors is compared, yielding a result indicative of the longest delay from among the selected delay paths. Various processing circuits provide further operations on the result of the comparison. A metastability correction circuit coupled in series with a bubble correction circuit may be provided to correct any glitches in the measurement data. A data output circuit receives a bubble-corrected output from a bubble correction circuit, the uncorrected raw data from the comparator, and feedback from the previously-generated result. Depending on the operating mode selected, the data output circuit may provide an output indicative of either a range of edge positions, an edge position of the longest path delay detected, the bubble corrected output, uncorrected raw data, or other processed data result. The feedback and/or computed results allow for adjustments to be dynamically made to the operating frequency or voltage of the IC to maintain optimum performance under differing PVT conditions, as well as analytical data describing the operation of the IC and operating frequency control loop.

Figure 1:
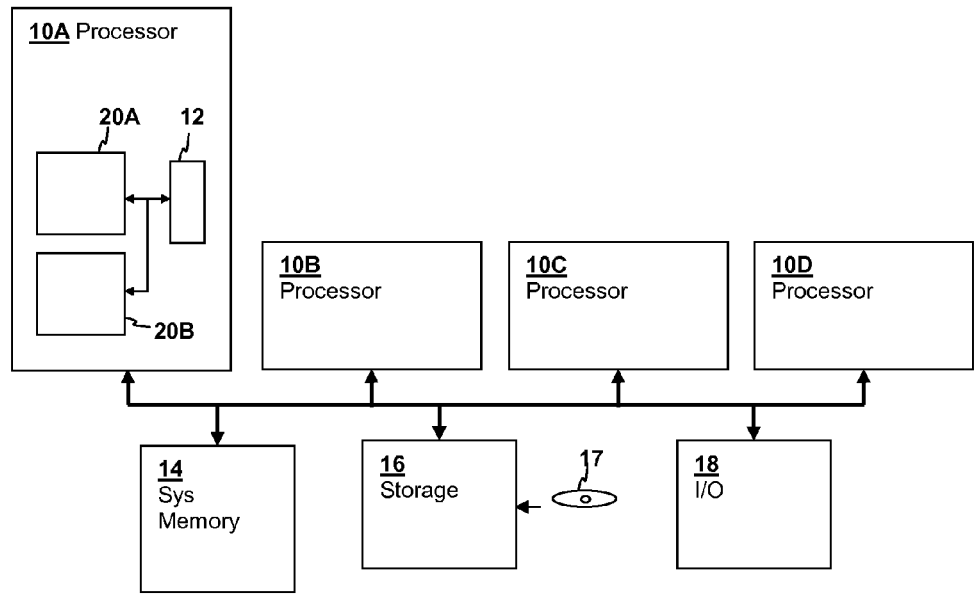
FIG. 1 is a block diagram illustrating a processing system in which techniques according to an embodiment of the present invention are practiced.

Referring now to FIG. 1, a processing system in accordance with an embodiment of the present invention is shown. The depicted processing system includes a number of SMT processors 10A-10D, each containing CPMs in conformity with an embodiment of the present invention. The depicted multi-processing system is illustrative, and processing systems in accordance with other embodiments of the present invention include uni-processor systems. Processors 10A-10D are identical in structure and include cores 20A-20B, along with local storage 12, which may be a cache level, or a level of internal system memory. Processors 10A-10D are coupled to main system memory 14 and a storage subsystem 16, which includes non-removable drives and optical drives, for reading media such as a CD-ROM 17 for loading program code for execution by processors 10A-10D. The illustrated processing system also includes input/output (I/O) interfaces and devices 18 such as mice and keyboards for receiving user input and graphical displays for displaying information. While the system of FIG. 1 provides an illustration of a system in which critical path monitoring techniques in accordance with an embodiment of the present invention may be implemented, it is understood that techniques of the present invention can be applied to other architectures and that embodiments of the present invention can be applied to other functional logic circuits and may be used in a variety of system architectures.

Figure 2:
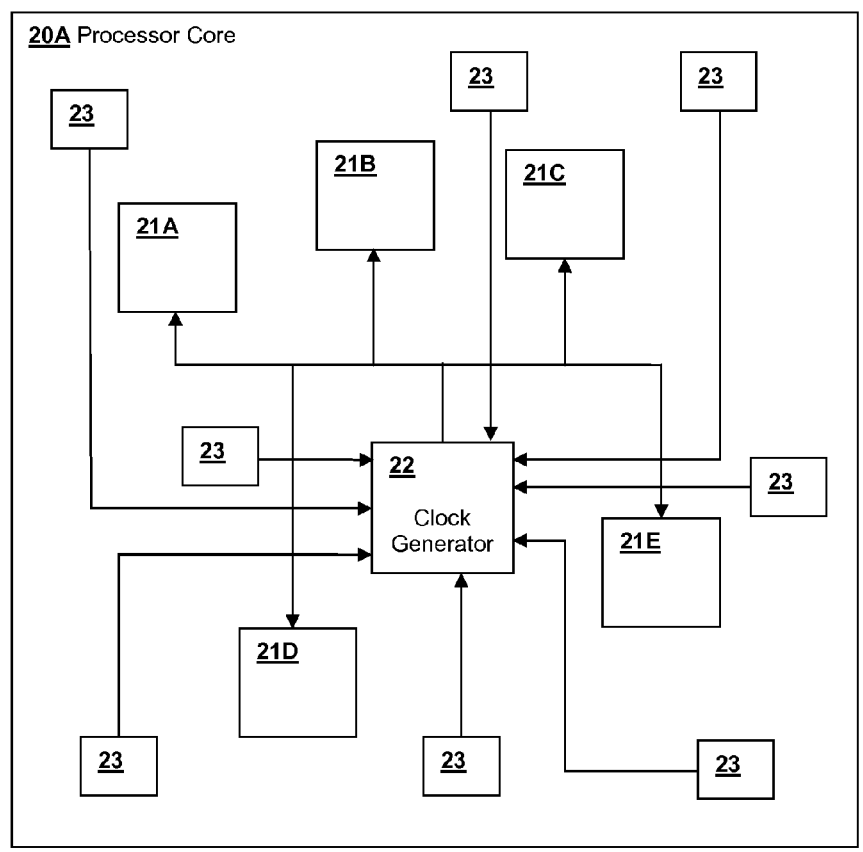
FIG. 2 is a block diagram illustrating details of processor core 20A of FIG. 1.

Referring now to FIG. 2, a processor core 20A in accordance with an embodiment of the present invention is shown. Processor core 20A includes functional logic blocks 21A-21E coupled to a clock generator 22. Functional logic blocks 21A-21E may be either identical or different in structure. Eight CPM circuits 23 are interspersed on the processor core 20A. CPM circuits 23 provide results of critical path delay measurements to clock generator 22, which dynamically adjusts the operating frequency of clock generator 22 in response to changing environmental conditions and a process point of processor core 20A. For example, as local power supply voltage and temperature variation within the processor core 20A cause changes in circuit delay within a particular one of functional logic blocks 21A-21E, a nearby one of CPM circuits 23 will provide an indication that a critical path delay within a particular one of functional logic blocks 21A-21E has changed. Clock generator 22 may determine a maximum operating frequency from a combination of the outputs of CPM circuits 23, or use the longest delay measurement provided by CPM circuits 23 to determine the operating frequency. In the depicted embodiment, clock generator 22 receives a real-time indication of critical path delay from each of CPM circuits 23. Clock generator 22 or another processing module receives a selectable second processed indication of critical path delay, as will be described in further detail below.

Figure 3:
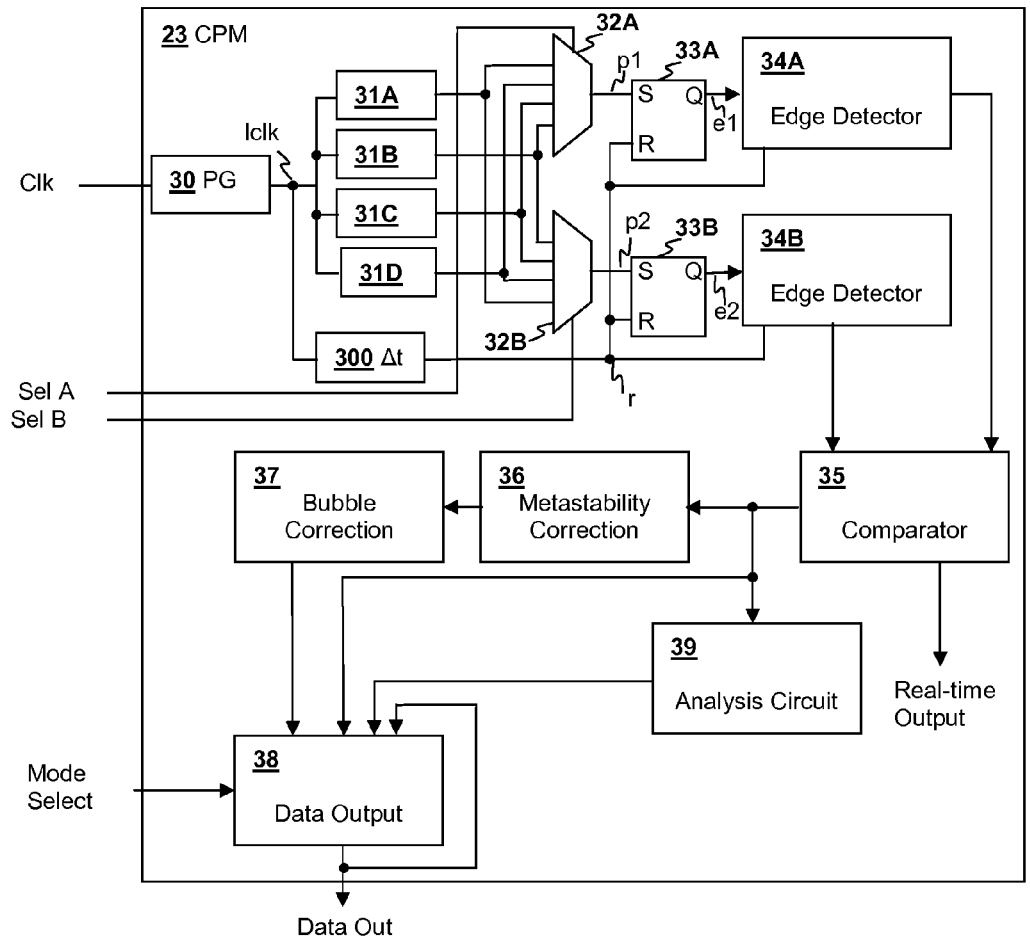
FIG. 3 is a block diagram of a critical path monitor circuit 23 in accordance with an embodiment of the present invention.

Referring now to FIG. 3, details of CPM circuit 23 in accordance with an embodiment of the present invention is shown. In the depicted embodiment, a pulse generator 30 generates a pulse signal lclk in response to an edge of clock signal Clk. Delay Δt 300 delays reset pulse signal r so that the reset of latches 33A-33B occur after the latest possible falling edges of pulse signals p1 and p2. Pulse signal lclk propagates through a critical path synthesizer circuit having multiple selectable delay paths 31A-31D that are used to synthesize a delay indicative of the critical path delay of processor core 20A. Selectable delay paths 31A-31D can include, but need not be limited to, chains of inverters, wire paths, logic gates, and SRAM read paths. Multiplexors 32A-32B select either the output of a single delay path 31A-D or a combination of two separate delay paths 31A-D, according to selection values Sel A and Sel B.

When pulse signals p1 and p2 arrive at latches 33A-33B, respectively, rising transitions in outputs e1-e2 of latches 33A-33B are provided to inputs of corresponding edge detectors 34A-34B, respectively. Comparator 35 performs a logical-AND operation on the outputs of edge detectors 34A and 34B, which, in turn, generates an output result indicative of the edge position of the last pulse edge to arrive. The output of comparator 35 is provided to a metastability correction circuit 36 and a data output circuit 38. The combination of edge detectors 34A-34B and comparator 35 generate an indication of the arrival time of either an edge of the pulse propagated through the longest of two different delay paths or an edge of the pulse propagated through a single delay path, according to whether selection values Sel A and Sel B select different delay paths or the same delay path. The output of comparator 35 is also provided as a real-time indication to track changes in the critical path delay. The real-time output may be encoded to reduce the number of bits required to represent the delay.

Metastability correction circuit 36 eliminates errors caused by metastable states occurring within edge detectors 34A-34B, as will be described in further detail below. When metastable conditions occur, because the values of the outputs of edge detectors 34A-34B are not necessarily resolved to the correct determined logical states, extraneous reversals in the edge position may result at the output of metastability correction circuit 36. The output of metastability correction circuit 36 is provided to a bubble correction circuit 37, which removes any extraneous edge reversals in the delay measurement results. A data analysis circuit 39 performs statistical calculations on an output of comparator 35 to provide data which can reflect, but need not be limited to, a minimum, maximum, or moving average of the output of comparator 35. A data output circuit 38 accepts an output of comparator 35, bubble correction circuit 37, data analysis circuit 39, and a feedback value from an output of data output circuit 38. Data output circuit 38 is a logic circuit that provides selectable delay measurement results processed according to an operating mode selected by a mode selection value Mode Sel.

Figure 4:
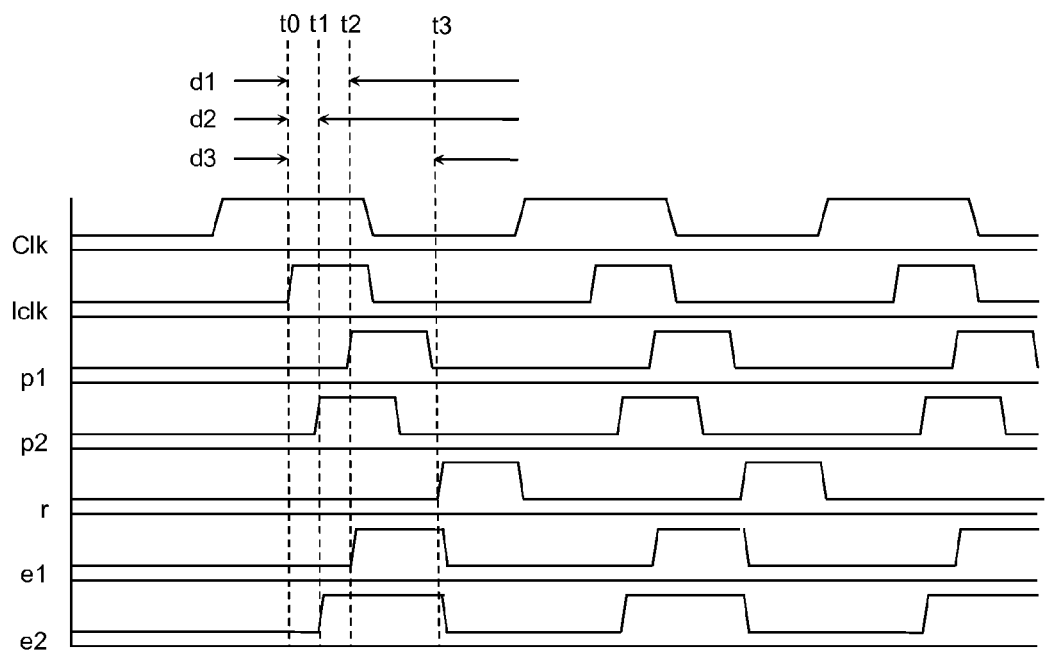
FIG. 4 is a timing diagram depicting signals within critical path monitor circuit 32.

Referring now to FIG. 4, signals within critical path monitor circuit 23 of FIG. 3 are shown in a timing diagram. Pulse signal lclk propagates through two different synthesized critical paths as selected by multiplexors 32A-32B, resulting in pulse signals p1 and p2 that arrive at corresponding latches 33A-33B of FIG. 3. Delay d1 is the time interval between rising edge of pulse signal lclk at time t0 and the arrival of the rising edge of p1 at time t2. Delay d2 is the time interval between the rising edge of pulse signal lclk at time t0 and the arrival of the rising edge of p2 at time t1. Delays d1-d2 differ due to the different delays of the synthesized critical paths 31A-31D of FIG. 3. Signals e1 and e2 are the output of latches 33A-33B, which are set in response to the rising edges of p1 and p2 respectively. Delay d3 is the time interval between the rising edge of pulse signal lclk at time t0 and the rising edge of delayed reset pulse signal r at time t3. The rising edge of reset pulse signal r resets of latches 33A-33B at time t3, which de-assert corresponding signals e1-e2.

Figure 5:
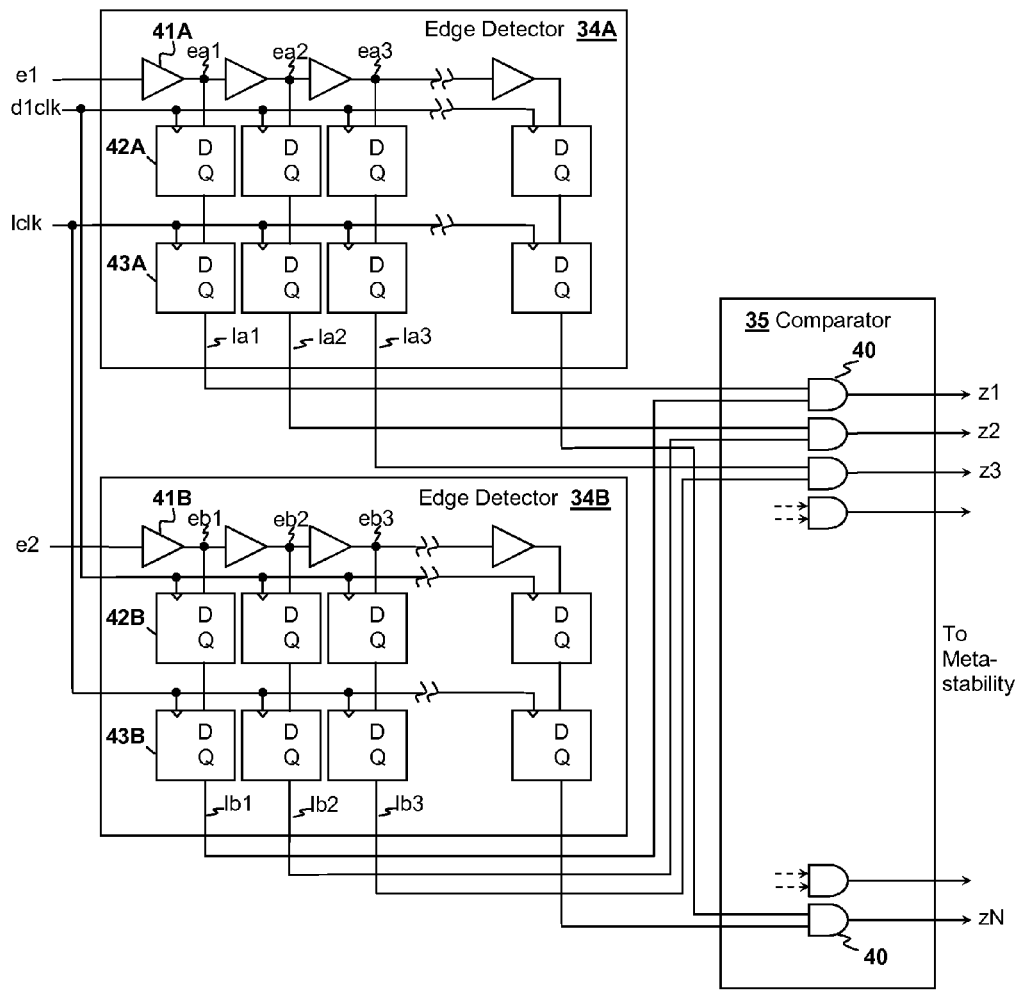
FIG. 5 is a schematic diagram depicting details of edge detector circuits 34A-34B and comparator 35 of FIG. 3.

Referring now to FIG. 5, details of edge detectors 34A-34B of FIG. 3 are shown in accordance with an embodiment of a present invention. In the depicted embodiment, signal e1, which is the output of latch 33A of FIG. 3, is provided to a delay line formed by a cascade of buffers 41A, which provide inputs to a plurality of transparent latches 42A forming a latch bank. Signals ea1-ea3 are delayed versions of signal e1 at the outputs of the first three of buffers 41A, which are progressively delayed by an additional buffer delay. When the delay of pulse signal lclk generated by pulse generator 30 through the selected one of the delay paths 31A-31D, multiplexor 32A, and latch 33A of FIG. 3 is such that edge detector 34A is in a proper operating range, a transition will be captured in one of the latches 43A when lclk is asserted and output as signal la1-la3. Signal e2, which is the output of latch 33B of FIG. 3, is provided to a delay line formed by a cascade of buffers 41B, which provides inputs to a plurality of transparent latches 42B forming a latch bank. Signals ea1-ea3 are delayed versions of signal e2 at the outputs of the first three of buffers 41B, which are progressively delayed by an additional buffer delay. When the delay of pulse signal lclk through the selected one of the delay paths 31A-31D, multiplexor 32B, and latch 33B of FIG. 3 is such that edge detector 34B is in a proper operating range, a transition will be captured in one of the latches 43B when lclk is asserted and output as signal lb1-lb3. Comparator 35, which is formed of a plurality of logical-AND gates 40, receives outputs la1-la3 and lb1-lb3 of latches 43A-43B, respectively, and provides a logic high result at bit positions only where the corresponding bit positions of the output of latches 43A and 43B are both logic high, yielding a result z1-zN indicative of the arrival time of the longest synthesized critical delay path.

Figure 6:
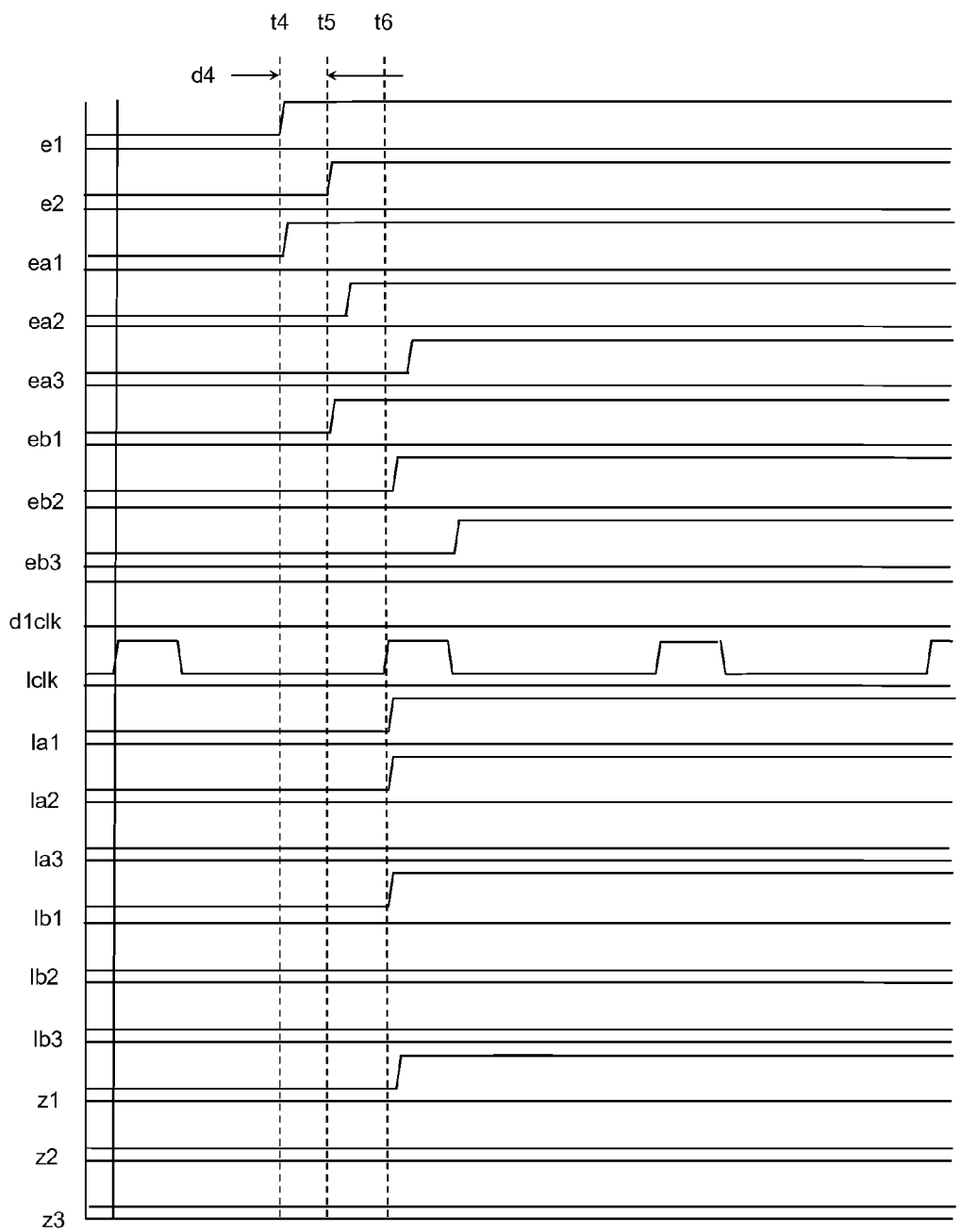
FIG. 6 is a timing diagram depicting signals within edge detector circuits 34A-34B and comparator 35 of FIG. 5.

Referring now to FIG. 6, signals within edge detector circuits 34A-34B of FIG. 5 are shown in a timing diagram. Delay d4 is the time interval between the rising edge of signal e1 at time t4 and the rising edge of signal e2 at time t5, at the outputs of latches 33A and 33B of FIG. 3, respectively. In the illustration, the rising edge of signal e1 arrives earlier than the rising edge of e2. Signals ea1-ea3 are the outputs of the first three of buffers 41A within edge detector 34A and are therefore each progressively delayed by one buffer delay. Signals eb1-eb3 are the outputs of the first three of buffers 41B within edge detector 34B and are therefore each progressively delayed by one buffer delay. In the depicted operating mode, latches 42A-42B of FIG. 3 are held transparent by d1clk which is continuously asserted. However, in other pulsed operating modes, latches 42A-42B may be clocked by a clock signal. The arrival of a rising edge at time t6 of pulse signal lclk latches the states of signals ea1-ea3 and eb1-eb3, by setting latches 43A and 43B to the non-transparent condition, providing corresponding latched outputs la1-la3 and lb1-lb3, respectively. Outputs la1 and lb1 are provided to a corresponding one of logical-AND gates 40 of FIG. 5, which yields a result z1. Outputs la2 and lb2 are provided to another one of corresponding logical-AND gates 40 of FIG. 5, which yields a result z2. Outputs la3 and lb3 are provided to one of the logical-AND gates 40 of FIG. 5, which yields a result z3. Thus, results z1-zN reflect the longest delay path, with the logic high value of signal z1 indicating the edge position of the longest critical path delay.

Figure 7:
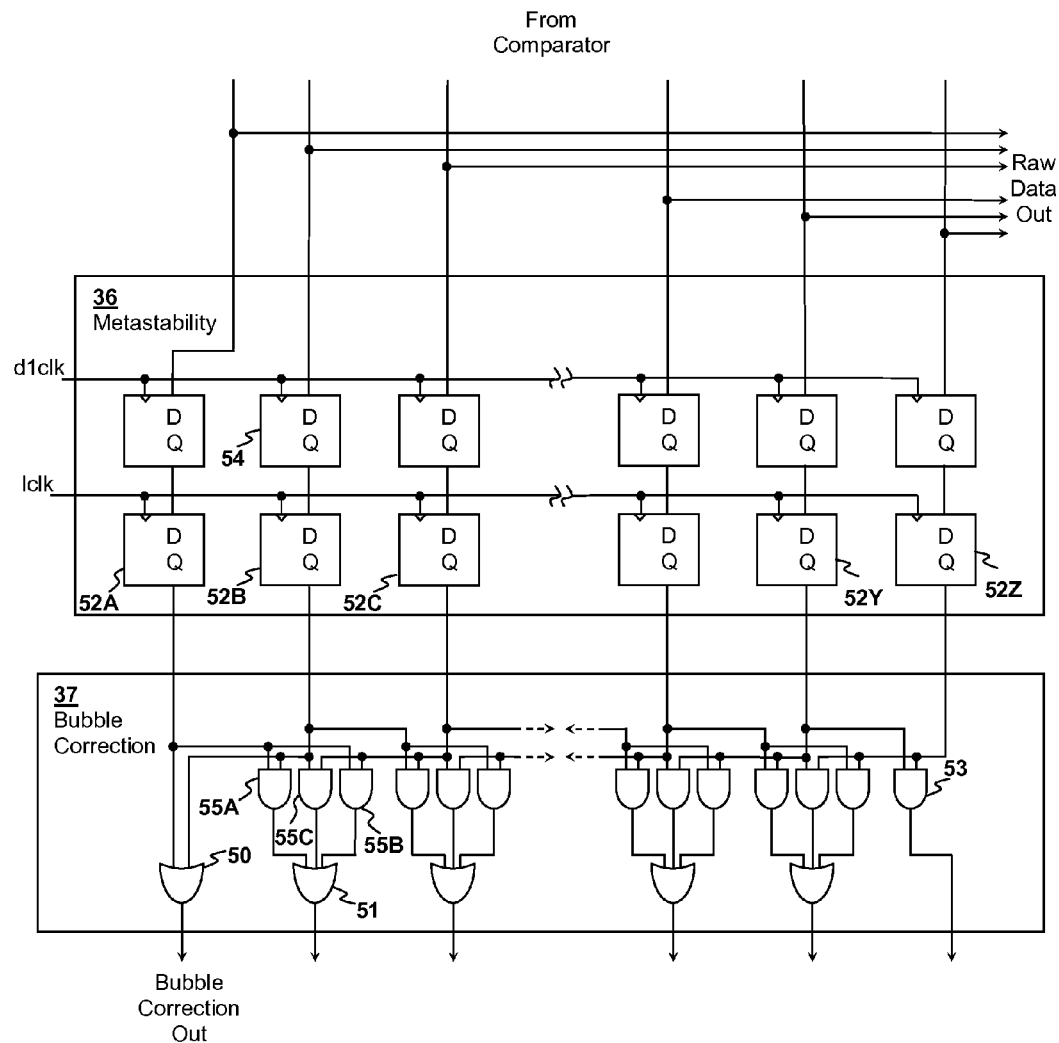
FIG. 7 is a schematic diagram depicting details of metastability correction circuit 36 and bubble correction circuit 37 of FIG. 3.

Referring now to FIG. 7, details of metastability correction circuit 36 and bubble correction circuit 37 of critical path monitor circuit 23 of FIG. 3 are shown in accordance with an embodiment of the present invention. Metastability correction circuit 36 eliminates errors caused an edge of a signal propagated through buffers within edge detector circuits 34A-34B, e.g., signals ea1-ea3 in edge detector 34A arriving at one of latches 42A at the same time as the falling edge of pulse signal lclk. In particular, since in the exemplary embodiment latches 42A are fast latches formed from cross-coupled inverters in which the outputs and inputs are directly-cross-coupled while latches 42A are transparent, a metastable state can be assumed by the outputs of the inverters for a time, resulting in an indeterminate logic states that takes some time to resolve to one logical value or the other. The circuit gain in comparator 35 forces metastable values at the output of edge detectors 34A-34B to resolve to a stable value, which is then captured in latches in metastability correction circuit 36. Because the metastable value is not necessarily resolved to the correct determined logical state, extraneous reversals in the edge position may result at the output of metastability correction circuit, as mentioned above. In the depicted embodiment, metastability correction circuit 36 receives the output of comparator 35, which is provided to a bank of latches 54. Latches 54 are held transparent by signal d1clk. Pulse signal lclk latches the outputs of latches 54 by setting another set of latches 52B to a non-transparent state. The outputs of latches 52A-52Z are provided to bubble correction circuit 37, which removes edge reversals from the output of latches 52-A-52Z.

Bubble correction circuit 37 contains a bank of majority detectors, which are made up of logical-AND and logical-OR gates. Logical-AND gate 55A receives the output of latch 52B corresponding to the current bit position and the output of latch 52A corresponding to the bit position of a next-later arrival time of an edge at the input of the edge detectors. Logical-AND gate 55B receives the output of latch 52B corresponding to the current bit position and the output of latch 52C corresponding to the bit position of the next-earlier edge arrival time. Logical-AND gate 55C receives the output of latch 52A corresponding to the bit position of the next-later edge arrival time and the output of latch 52C corresponding to the bit position of the next-earlier edge arrival time. Logical-OR gate 51 receives the outputs of logical-AND gates 55A-55C to provide an output indicative of the logical majority of the binary states of the outputs of latches 52A-52C. Since the first bit position is the bit position indicative of the latest measurable arrival time of the pulse edge (which corresponds to the longest measurable synthesized critical path delay), majority detection is not provided at the first bit position, since under worst case design conditions the edge will always arrive at the input of the corresponding edge detector within one buffer delay after the falling edge of pulse signal lclk. Therefore, the outputs of latches 52A-52B are coupled directly to the inputs of logical-OR gate 50. Likewise, since the last bit position is the bit position indicative of the earliest possible arrival of the edge at the input of the edge detector, majority detection is also not required. Therefore, the output of latches 52Y-52Z are coupled directly to the inputs of logical-AND gate 53. The output of bubble correction circuit 37 is indicative of the raw data of comparator 35 of FIG. 3 with any error due to metastability and any reversals in the bit pattern removed.

Figure 8:
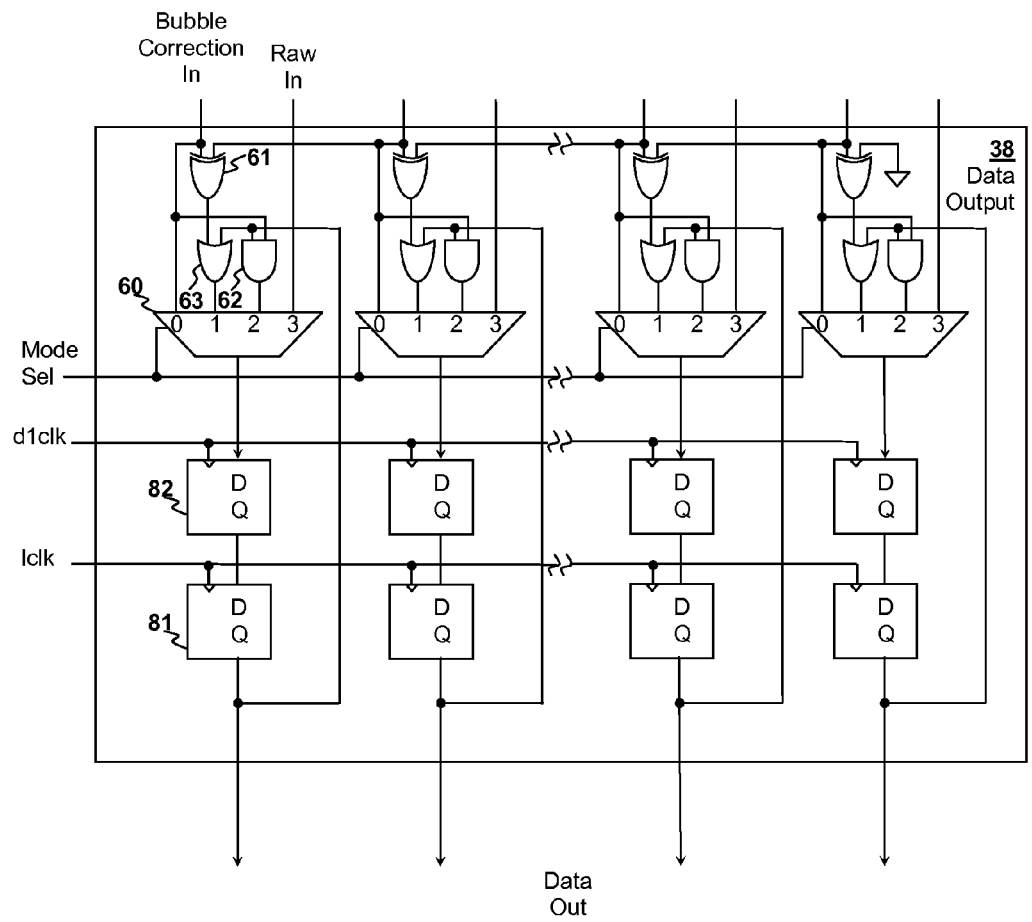
FIG. 8 is a schematic diagram depicting details of data output circuit 38 of FIG. 3.

Referring now to FIG. 8, details of data output circuit 38 of critical path monitor circuit 23 in FIG. 3 are shown in accordance with an embodiment of a present invention. In the depicted embodiment, a multiplexor 60 is used to select output data for one of four different operating modes according to a mode selection value Mode Sel. The operating modes receive as input either a stabilized and bubble-corrected output Bubble Correction In from the bubble correction circuit 37 of FIG. 7, an uncorrected result Raw In from the output of comparator 35 of FIG. 5, or a value from a previous result Data Out of the data output circuit 38. The output of multiplexor 60 is selected according to the operating mode selected by mode selection value Mode Sel. A bank of latches 82 receives the output of multiplexor 60. Latches 82 are held transparent by signal d1clk. Pulse signal lclk latches the outputs of latches 82 by setting another set of latches 81 to a non-transparent state. The outputs of latches 81 are provided as signal Data Out and also to logical-OR gate 63 and logical-AND gate 62.

The following is an exemplary set of operating modes supported by data output circuit 38 of FIG. 8 in accordance with an embodiment of the present invention:

Corrected Data Output Mode (Mode 0)—This mode provides the output from the bubble correction circuit 37 of FIG. 7 to multiplexor 60 in Mode 0 to output the stabilized and bubble-corrected logical-AND result of comparator 35 of FIG. 5. Multiplexor 60 provides the output of bubble correction circuit 37 as a result to Data Out, when mode selection value Mode Sel is zero.

Provide Skitter Sticky Data (Mode 1)—This mode records a range of edge positions that have been measured since the last reset of data output circuit 38. In Mode 1, a logical-XOR gate 61 receives a first input from the bubble-corrected result Bubble Correction In from bubble correction circuit 37 of FIG. 7 and a second input from the output of bubble correction circuit 37 of FIG. 7 at the next bit position corresponding to the next-shorter delay. The output of logical-XOR gate 61 is a bit-pattern directly indicative of the position of the edge. A logical-OR gate 63 receives a first input from the output of logical-XOR gate 61 and previous value Data Out, yielding a result indicative of a range of edge positions since the last reset, since the output of logical-OR gate 63 will remain in a logic high state for each bit position in data output circuit 38 that has ever received an edge position indication from the corresponding logical-XOR gate 61. When mode selection value Mode Sel is 1, Multiplexor 60 provides output of logical-OR gate 63 to result Data Out.

Provide Sticky Data (Mode 2)—This mode records the edge position of the longest delay path since the last reset. In this mode, a logical-AND gate 62 receives bubble-corrected result Bubble Corr In from bubble correction circuit 37 of FIG. 7 and previous value Data Out, yielding a result indicative of the longest path delay measured since the last reset. When mode selection value Mode Sel is 2, multiplexor 60 provides the output of logical-AND gate 62 as result Data Out.

Provide Raw Data (Mode 3)—This mode bypasses metastability correction circuit 36 and bubble correction circuit 37 of FIG. 7 to output the raw output of comparator 35 of FIG. 5. When mode selection value Mode Sel is 3, multiplexor 60 provides the output of comparator 35 of FIG. 5 as result Data Out.

The set of operating modes described above is not exhaustive, and is only exemplary of a basic set of operating modes that can provide raw or processed critical path delay information describing the performance of an IC under changing environmental conditions and particular process characteristics of the IC.

While the invention has been particularly shown and described with reference to the preferred embodiments thereof, it will be understood by those skilled in the art that the foregoing and other changes in form, and details may be made therein without departing from the spirit and scope of the invention.

What is claimed is:

1. An integrated circuit, comprising:
a functional logic circuit for providing a function of the integrated circuit, wherein the functional logic circuit has a critical path having a critical path delay;
a pulse generation circuit for generating a pulse having a rising edge and a falling edge;
a critical path synthesizer circuit having an input coupled to an output of the pulse generation circuit and having at least one delay path for providing synthesized delay indicative of at least a portion of the critical path delay;
a monitoring circuit having an input coupled to an output of the critical path synthesizer circuit, for measuring a relative delay through at least one delay path of a single one of the rising edge or falling edge of the pulse and providing a first real-time output indicative of the measured relative delay; and
a data output circuit having an input coupled to an output of the monitoring circuit and having selectable operating modes, wherein a processed result is computed from the measured relative delay according to the selected operating mode and provided as a second processed output indicative of the measured relative delay.

2. The integrated circuit of claim 1, wherein the monitoring circuit comprises at least one edge detector for detecting an arrival of a single one of the rising edge or falling edge of the pulse and providing an indication of edge position as the first real-time output.

3. The integrated circuit of claim 2, wherein in a first one of the operating modes, the data output circuit provides an indication of an earliest edge position from among multiple edge positions as provided by the monitoring circuit as the second processed output.

4. The integrated circuit of claim 3, wherein in a second one of the operating modes, the data output circuit captures a range of edge positions of multiple edge positions as provided by the monitoring circuit and provides an indication of the range of edge positions as the second processed output.

5. The integrated circuit of claim 4, wherein in a third one of the operating modes, the data output circuit provides an unprocessed indication of edge position as the second processed output.

6. The integrated circuit of claim 2, wherein in a first one of the operating modes, the data output circuit captures a range of edge positions of multiple edge positions as provided by the monitoring circuit and provides an indication of the range of edge positions as the second processed output.

7. The integrated circuit of claim 1, wherein in a first one of the operating modes, the data output circuit provides an unprocessed indication of edge position as the second processed output.

8. The integrated circuit of claim 1, further comprising a metastability correction circuit for removing glitches due to circuit metastability, having an input coupled to an output of the monitoring circuit, and a bubble correction circuit for correcting erroneous bit patterns, with an input coupled to an output of the metastability correction circuit, wherein the data output circuit is coupled to an output of the bubble correction circuit.

9. The integrated circuit of claim 1, wherein the critical path synthesizer circuit has a plurality of delay paths, wherein the delay paths are designed to have different process-voltage-temperature slopes, and further comprising an analysis circuit for computing a critical path delay result between the relative delays of at least two of the delay paths as measured by the monitoring circuit, coupled between the monitoring circuit and the data output circuit.

10. The integrated circuit of claim 1, further comprising a latch coupled between the critical path synthesizer circuit and the monitoring circuit for capturing the single one of the rising or falling edge of the pulse.

11. An integrated circuit, comprising:
a functional logic circuit for providing a function of the integrated circuit, wherein the functional logic circuit has a critical path having a critical path delay;
a pulse generation circuit for generating a pulse having a rising edge and a falling edge;
a critical path synthesizer circuit having an input coupled to an output of the pulse generation circuit and having a plurality of delay paths, wherein the delay paths are designed to have different process-voltage-temperature slopes for providing synthesized delay indicative of at least a portion of the critical path delay, providing relative delays of at least two of the delay paths as output;
a latch coupled between the critical path synthesizer circuit and the monitoring circuit for capturing the single one of the rising or falling edge of the pulse;
a monitoring circuit having an input coupled to an output of the critical path synthesizer circuit, for measuring a relative delay through at least one delay path of a single one of the rising edge or falling edge of the pulse and providing a first real-time output indicative of the measured relative delay;
a metastability correction circuit having an input coupled to an output of the monitoring circuit and a bubble correction circuit with an input coupled to an output of the metastability correction circuit, providing an error-corrected measured relative delay result; and
a data output circuit having an input coupled to an output of the bubble correction circuit and having selectable operating modes, wherein a processed result is computed from the measured relative delay according to the selected operating mode and provided as a second processed output indicative of the measured relative delay, and wherein in a first one of the operating modes, the data output circuit provides an indication of an earliest edge position of multiple edge positions as provided by the monitoring circuit as the second processed output, and wherein in a second one of the operating modes, the data output circuit captures a range of edge positions of multiple edge positions as provided by the monitoring circuit and provides an indication of the range of edge positions as the second processed output, and wherein in a third one of the operating modes, the data output circuit provides an unprocessed indication of edge position as the second processed output.

12. A method of monitoring a critical path delay, comprising:
propagating a pulse having a rising edge and a falling edge through a delay path for
providing a synthesized delay indicative of at least a portion of the critical path delay;
measuring a relative delay of a single one of the rising edge or falling edge of the pulse with a monitoring circuit;
providing a first real-time output indicative of the measured relative delay;
selecting an operating mode from one of multiple operating modes; and
computing a second processed result from the measured relative delay according to the selected operating mode and providing the second processed result as a second processed output.

13. The method of claim 12, wherein the measuring comprises detecting an arrival of a single one of the rising edge or falling edge of the pulse and providing an edge position as the measured relative delay.

14. The method of claim 13, wherein in a selected first operating mode, the computing comprises retaining an edge position corresponding to a longest critical path delay from among multiple edge positions as provided by the monitoring circuit.

15. The method of claim 14, wherein in a selected second operating mode, the computing comprises capturing a range of edge positions of multiple edge positions as provided by the monitoring circuit.

16. The method of claim 13, wherein in a selected first operating mode, the computing comprises capturing a range of edge positions of multiple edge positions as provided by the monitoring circuit.

17. The method of claim 12, wherein in a selected first operating mode, the data output circuit provides the measured relative delay without computing the result.

18. The method of claim 12, further comprising stabilizing the measured relative delay utilizing a metastability correction circuit and correcting the stabilized measured relative delay utilizing a bubble correction circuit, and wherein the computing computes the result from the stabilized and corrected measured relative delay.

19. The method of claim 12, wherein the propagating propagates a pulse having a rising edge and a falling edge through a plurality of delay paths, wherein the delay paths are designed to have different process-voltage-temperature slopes, further comprising interpolating a result between at least two measured relative delays as measured by the monitoring circuit, and wherein the computing computes a result from the interpolated result according to an operating mode selected from one of multiple operating modes.

20. The method of claim 12, further comprising latching the pulse before measuring the relative delay by the monitoring circuit.

* * * * *